(12) United States Patent
Pandelisev

(10) Patent No.: US 6,908,510 B2
(45) Date of Patent: Jun. 21, 2005

(54) MATERIAL PURIFICATION

(75) Inventor: Kiril A. Pandelisev, Mesa, AZ (US)

(73) Assignee: Phoenix Scientific Corporation, Mesa, AZ (US)

( * ) Notice: Subject to any disclaimer, the term of this patent is extended or adjusted under 35 U.S.C. 154(b) by 0 days.

(21) Appl. No.: 10/011,718

(22) Filed: Dec. 11, 2001

(65) Prior Publication Data

US 2002/0053317 A1 May 9, 2002

Related U.S. Application Data

(60) Division of application No. 09/505,432, filed on Feb. 16, 2000, now Pat. No. 6,352,588, which is a continuation-in-part of application No. 09/392,647, filed on Sep. 9, 1999, now Pat. No. 6,402,840.

(51) Int. Cl.[7] .............................................. C30B 15/06
(52) U.S. Cl. ............................ 117/27; 117/26; 117/47; 117/914; 117/922; 117/34
(58) Field of Search ............................... 117/26, 27, 47, 117/914, 922, 34

(56) References Cited

U.S. PATENT DOCUMENTS 5,993,540 A * 11/1999 Pandelisev .................... 117/27

* cited by examiner

Primary Examiner—Nadine Norton
Assistant Examiner—Matthew Anderson
(74) Attorney, Agent, or Firm—James Creighton Wray; Meera P. Narasimhan

(57) ABSTRACT

For producing ultra pure materials a first station has a porous gas distributor. A material supply supplies material to the porous gas distributor. A gas source supplies gas to the distributor and through the distributor to the material in contact with the distributor. A heater adjacent the porous gas distributor heats and melts the material as gas is passed through the material. Dopant and a treatment liquid is or solid supplied to the material. Treated material is discharged from the first station into a second station. A second porous gas distributor in the second station distributes gas through the material in the second station. A crucible receives molten material from the second station for casting, crystal growing in the crucible or for refilling other casting or crystal growth crucibles. The material and the porous gas distributor move with respect to each other. One porous gas distributor is cylindrical and is tipped. The material supply is positioned above a lower end of the cylindrical porous gas distributor, and the discharge is positioned adjacent an opposite, raised end of the distributor. The cylindrical distributor is tippable for emptying material. Multiple parallel stations discharge multiple materials into a subsequent station or crucible.

54 Claims, 2 Drawing Sheets

MATERIAL PURIFICATION

This application is a division of application Ser. No. 09/505,432 filed Feb. 16, 2000, now U.S. Pat. No. 6,352,588, which is a continuation-in-part of application Ser. No. 09/392,647 filed Sep. 9, 1999, now U.S. Pat. No. 6,402,840.

BACKGROUND OF THE INVENTION

The present invention relates material purification. The material can be any material either used in its elemental form, chemical compounds, and their combinations in the form of an alloy. The purified material will be used for product fabrication, casting of various shapes and sizes, as well as raw material for growing crystals.

Purity of the material and compositional uniformity are some of the most important characteristics in crystal growth and product performance. The quality of final products are controlled at the beginning by carefully purifying, precisely doping and controllably mixing elements to produce crystals and alloys of known quality and predictable characteristics.

Needs exist for improved purification and treatment of materials in powder and molten and solid states.

SUMMARY OF THE INVENTION

The present invention provides methods and apparatus for ultra purification of materials.

The present invention provides improvements for precisely controlling purity, quality, uniformity and chemical composition of crystals and alloys.

Powder is dispensed on a porous gas distributor in a reduced pressure chamber at a first station. Drying and reactive gases flow through the porous distributor and through the powder. Ultra purification takes place by drying and reactive gas treatment. The powder is transferred into a second station. In another embodiment, the temperature of the first part is increased so that melting occurs. Purification continues following melting. The molten material is transferred into a second station, which is a liquid purification chamber, either by conveyor or by gravity directed flow by tilting of the first section. Purification by reactive gas treatment continues. The liquid purification chamber may be placed at a lower position and have volume suitable to accommodate the liquefied material from the first station. The liquid purification chamber is contained within the same or a separate reduced pressure chamber. A pump or pumps withdraw the reactive gas and impurities are thereby carried out of the powdered or molten material. A dopant controller allows for controlling the dopant level, if any.

When the chamber is filled to a desired level, the liquid material purification process begins. Reactive gases, liquid or solid materials are used during this cycle. This cycle may be a follow-up cycle or parallel cycle to the one for powder purification. Reactive gases are introduced through a porous distributor. When appropriate material properties have been obtained, the liquefied material may be doped and transferred to a third station or chamber, which is a purified liquid-receiving chamber. The third chamber may be at the same level or at a lower level for gravity flow transfer. The third chamber may be either:

a crystal growth crucible;

a molten material storage for continuous casting or crystal growth; or a chamber for casting the material in certain shapes and sizes.

All chambers may have tilt mechanisms for providing for easy material transfer from one chamber into the next in controlled flow. All chambers may be in one large vacuum chamber or in separate vacuum chambers that allow for material transfer and handling.

Several purification stations may feed the cast/refill/crystal grower, either to provide continuous operation or to provide a proper mix of distinct elements or compounds to form molten material for various alloy products. The mixing may be at the beginning or may be continuous to ensure proper element ratio in the alloy and constant dopant level, if any, in the alloy.

Purification station cascades may be employed for specific applications.

One purification station has a vacuum chamber containing a cylindrical or other rotating porous gas distributor, a material supply line, a gas supply line, a dopant supply line, a vacuum line, heaters, a tilting mechanism, a rotation mechanism, a liquid dispensing line, a control panel for all of the above, and other control data related issues.

The material to be purified is supplied through the supply line. After a required quantity has been introduced, the processing of the material begins. Drying and chemical treatment of the material, as well as doping and mixing of all components, is accomplished during this step.

When the purification has been completed, the material may be transferred to a crystal growth crucible or other applications having need of the purified material.

The material may be subjected to a melting and purification process in its molten state. If the space allows, more material may be added to achieve a certain melt level in the chamber. When all the material has been melted and outgassed, the purification procedure is conducted. If the final product to be delivered needs dopant, suitable amounts of dopant and reactive materials are added to the melt. The rotation of the chamber containing the material provides for proper mixing of the reactive materials and/or the dopant.

When the material has the desired properties, it is delivered to a casting station or to a refilling station, or directly to a crystal grower for batch or continuous crystal growth.

Multiple cascade purification stations may be employed to achieve increased levels of purity of single elements or single compounds, or to form special alloys and to maintain desired single element quality, single compound quality and/or alloy quality and composition.

The purification station cascade can be enclosed in one vacuum chamber, or each station can be enclosed in a separate vacuum chamber. Means of material transfer are used to move material from one station to another or to an application such as crystal grower, casting station or other not specified application.

Purification station cascades may be used in the Pandelisev Crystal Grower (U. S. Pat. No. 5,993,540) or in a Standard Bridgman-Stockbarger approach, or in a Bridgman-Stockbarger process employing an embedded purification station.

Embedded purification station cascade consisting of plurality of purification stations may be considered for certain applications. They can be all housed in a separate vacuum chambers and will have the capability to communicate the material from one station to another in a controlled manner. Or they can be placed one adjacent to another in horizontal or vertical or semi-vertical arrangement within a large vacuum chamber or within the chamber of crystal grower having Bridgman-Stockbarger or Pandelisev (continuous or batch type) crystal grower.

The invention provides methods and apparatus for producing ultrapure materials. The first station has a chamber and a porus gas distributor in the chamber. The chamber may be elliptical, hexagonal and may be rectangular or have conical or truncated cone shape. A material supply supplies material to the chamber. A gas source connected to the porous distributor supplies gas to the distributor and through the distributor to the material in contact with the distributor. A heater(s) adjacent to the chamber heats the material as gas is passed through the material. One or more discharge ports on the bottom and/or the sides of the chamber discharges the treated material from the first station into a second purification station, material storage or to crystal growth crucible for continuous or batch type growth of single crystal or casting applications. A dopant controller supplies/controls the dopant levels of the material. A treatment liquid or solid supply supplies treatment liquid or solid to the material.

A second station is positioned adjacent or under the discharge of the first station. The second station has a chamber and a porous gas distributor in the chamber. The chamber may have elliptical, hexagonal and may be rectangular of having conical or truncated cone shape. Through the discharge port(s) of the first station material is supplied to the second chamber. A gas source connected to the porous distributor supplies gas to the distributor and through the distributor to the material in contact with the distributor. A heater(s) adjacent to the chamber heats the material as gas is passed through the material. One or more discharge ports on the bottom and/or the sides of the chamber discharges the treated material from the first station into a second purification station, material storage or to crystal growth crucible for continuous or batch type growth of single crystal or casting applications. A dopant controller supplies/controls the dopant levels of the material. A treatment liquid or solid supply supplies treatment liquid or solid to the material.

A third purification station, material storage or a crystal growth crucible for continuous or batch-type growth of single crystal or casting applications may be placed adjacent or under the second station.

Multiple first stations may discharge multiple materials into a second station. Multiple second stations may discharge molten material into the third station crucible.

These and further and other objects and features of the invention are apparent in the disclosure, which includes the above and ongoing written specification, with the claims and the drawings.

DETAILED DESCRIPTION OF THE PREFERRED EMBODIMENTS

Figure 1:
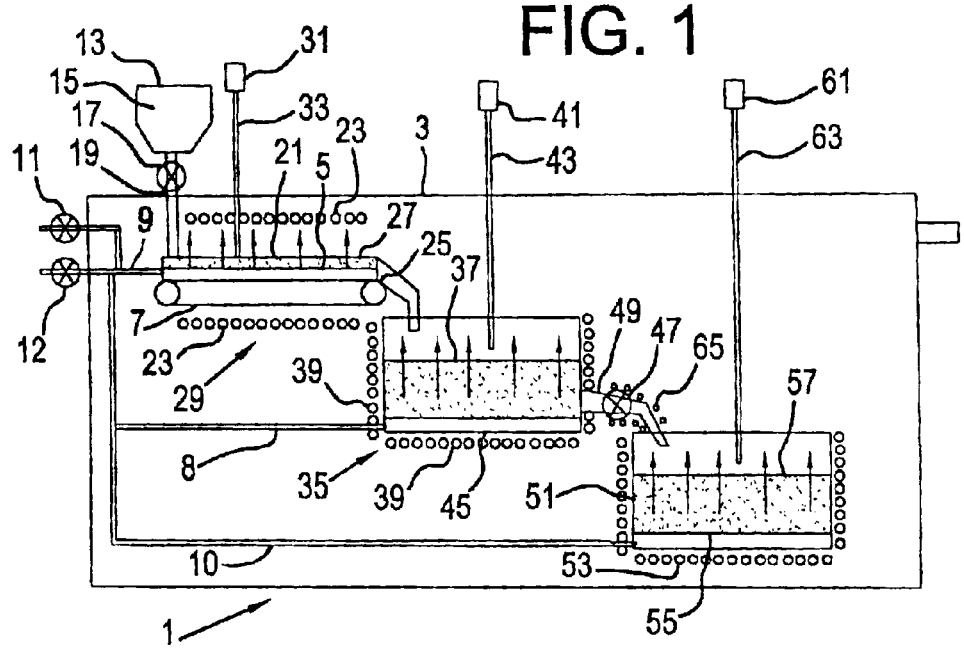
FIG. 1 shows a cascaded purification apparatus within a vacuum chamber.

Referring to FIG. 1, a purification system is generally indicated by the numeral 1. A vacuum chamber 3 surrounds the apparatus. Alternatively, individual vacuum chambers may surround each element of the apparatus.

A porous gas distributor 5 is positioned above a conveyor 7. A gas inlet tube 9 with valves 11 and 12 controls gas that is provided through the porous gas distributor. The distributor 5 may be a porous plate, a series of porous plates, tubes or poles or a porous grid.

A material supply 13 contains a powdered starter material 15. A valve 17 and dispenser 19 form a layer 21 of the powdered material on the conveyor 7. The powdered material moves along the porous gas distributor 5 as the conveyor moves. A heater 23 heats the powdered material while the chamber is evacuated and gas is distributed through the material to outgas and treat the material and to purify the material.

An example of the gas that might be distributed through distributor 5 is an inert gas or a reactive gas such as vapors of various reactants mixed with inert gas. For example, argon may be bubbled through an acid to carry some of the acid vapors through the porous gas distributor and through the material. The heater 23 may be incrementally raised in temperature towards the discharge end 25 of the conveyor 7 so that liquid molten material 27 is discharged from the first station 29.

A dopant supply 31 with a dopant injector 33 is supplied at the first station 29 to supply dopant material to the powdered or molten material.

In the second stage 35, molten material 37 is maintained in a liquid condition by heaters 39. Dopant 41 is supplied through director 43 to the molten material as required. The porous plate 45 is connected to the gas supply 8 to supply purification gases through the porous gas distributor 45 and to bubble the gases through the molten material 37.

When the material is ready for discharge, valve 47 on discharge line 49 is opened, and the molten material is flowed to a crucible 51. Heaters 53 maintain the temperature of the liquid ire above the melting temperature, and porous gas distributor 55 is connected to a gas supply 10 to bubble reactive gas through the molten material 57 in the crucible 51. The crucible 51 may be used for casting or crystal growth, or as a supply of molten material to a grower or casting apparatus.

Dopant or reactive liquid or solids may be supplied from source 61 through tube 63 to the molten material 57 within the crucible 51. Heater 65 may be used to open and close the valve 47 to flow molten material 37 from second station 35 into the crucible 51.

Several first and second stations may be used to supply one crucible 51 so that the material from different stations may be mixed. Alternatively, several first stations may supply a second station in which the molten material is mixed before the molten material is released to the crucible 51.

Figure 2:
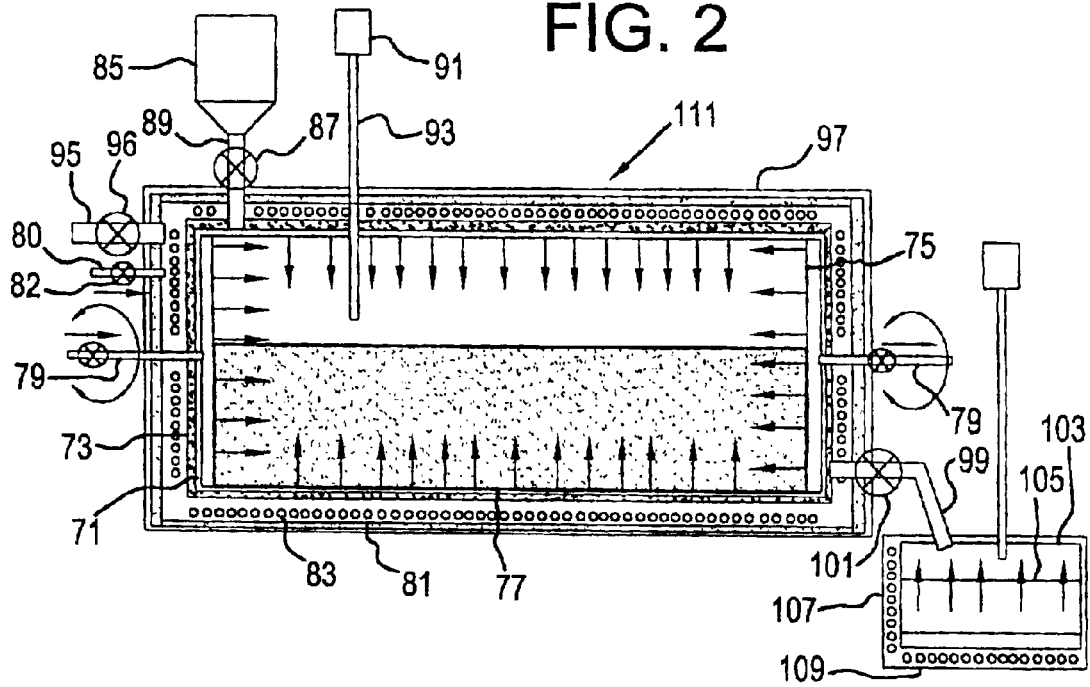
FIG. 2 shows a rotating purification apparatus.

Referring to FIG. 2, a relatively movable porous gas distributor 71 moves with respect to a crucible 73. Either the crucible or the porous gas distributor may oscillate, both may oscillate, or one or both may rotate with respect to the other. As shown in FIG. 2, the porous gas distributor rotates within the crucible. The porous gas distributor 71 and the crucible 73 have openings for admitting or discharging the crystal material. Alternatively, the porous gas distributor 71 is formed with radial ribs on its sides 75 or longitudinal slats 77 or paddles on its cylindrical sides, so that the material may freely flow into and out of the porous gas distributor cylinder. Gas supplies 79 extend through gimbals (not shown) that support the porous gas distributor for oscillation or rotation with respect to the crucible 73. The longitudinal slats 77 may be shaped in such a way as to give the best stirring effect. For example, the slats may be formed as paddles or foils or may be inclined to provide mixing of the powder and molten material within the crucible.

Insulation 81 surrounds the crucible, and a heater 83 is embedded in the insulation to maintain the crucible at the desired temperature for treatment of the material. Material is supplied from a supply 85 through a valve 87 and a distributor 89. Dopant or treatment liquid or solid may be supplied from supply 91 through treatment tube 93.

A vacuum line 95 and valve 96 are connected to the chamber 97 to maintain vacuum within the vacuum chamber 97. Gas piping 80 and valves 82 are connected to the initial stage 111 for supplying or venting gas from the initial stage. The discharge line 99 and a valve 101 control discharge of the treating material into a holding crucible 103, where it is held in molten form 105 by heaters 107 within a vacuum chamber 109.

One or more of the initial stages 111 may be connected to supply the crucible 103 with distinct materials to form alloys.

The crucible 103 is used as a molten supply to supply crystal growers or casting apparatus for crystals, or the crucible 103 may be the crystal growth crucible itself.

Figure 3:
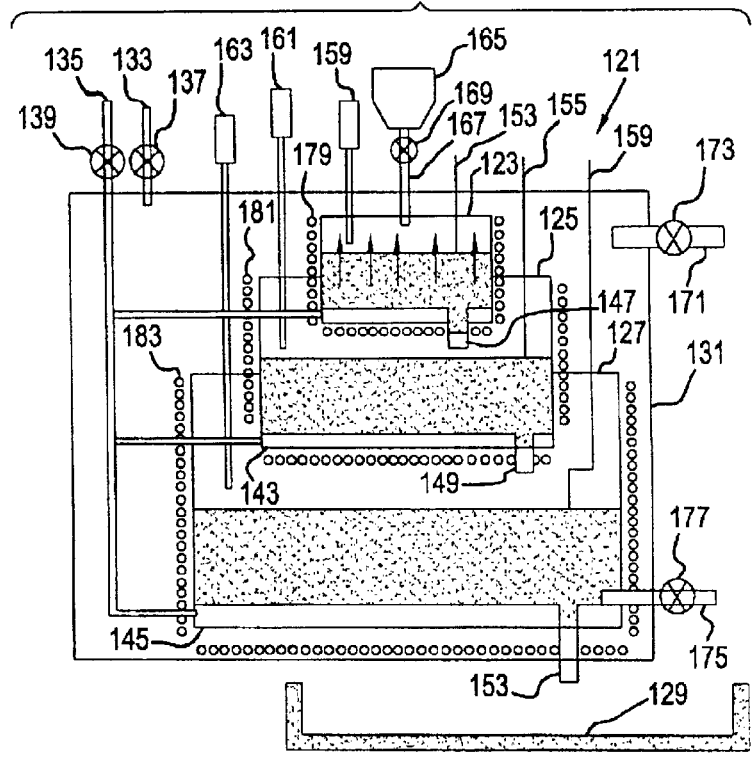
FIG. 3 shows stacked purification stations.

FIG. 3 shows stacked purification stations 121. The stack 121 has at least one station; FIG. 3 shows three stations 123, 125 and 127. All the stations 123, 125 and 127 and the crucible 129 may be contained in one vacuum chamber 131. Alternatively, separate vacuum chambers may be used for each station and the crucible. Alternatively, as shown in FIG. 3, the stations 123, 125 and 127 may be contained within one vacuum chamber 131, while the crucible 129 is outside the vacuum chamber.

The stacked stations 121 are inside or outside the crystal grower 129 for continuous shaped crystal growth, continuous plate growth, casting chamber growth, or crucible batch plate growth. The stacked stations are suitable for stand alone units that are used for refill of any type of crystal growth system, material casting system, or the like.

The gas supply 133 and the reactive gas supply 135 come from the top of the main crucible, as shown in FIG. 3, and may have multiple entry ports in the porous distributors. Each chamber may be connected to one or more than one reactive gas or inert gas sources. Each station may have its own independent gas line circuit, sources, and valves. Reactive gas may flood the whole vacuum chamber.

As shown in FIG. 3, valves 137 and 139 outside the vacuum chamber 131 control the supply of gas and reactive gas. Reactive gas supply 135 supplies the porous distributors 141, 143 and 145 of each station 123, 125 and 127 individually. The gas supply 133 floods the entire chamber 131. Vacuum inlet 171 and valve 173 are used to create and maintain a vacuum in the chamber 131.

A purification station 123, 125 and 127 may have an open top, or a lid. The purification station 131 may be independently heated, or it may be heated by a common heating assembly. As shown in FIG. 3, each purification station has its own heating assembly 179, 181 and 183. Alternatively, one heating assembly may be used to heat the entire chamber 131.

The plug assembly and the transfer tube with valve has a tube with a plug and a heater controlled shut-off valve. The purification chamber might have more than one plug assembly or valve. The material transfer may be through openings 147, 149 and 151 on the bottom or sides of the stations. As shown in FIG. 3, material transfer may also be accomplished through the use of discharge tubing 175 located on the side of a purification station. A valve 177 may be used to control the discharge of material through the discharge tubing 175. Plug assemblies 153, 155 and 157 may be used to control transfer of material through the openings to the next purification station. The transfer may be facilitated by gravity or by other means, such as a suction transfer or a similar method.

The dopant controller may provide various dopants, and the means for controlling their concentrations. This port may also be used to provide purification reactive material in both liquid and solid form. As shown, each purification station may have its own dopant distributor 159, 161 and 163.

Material is provided to the first purification station 123 from a material distributor 165 through supply 167. A valve 169 may be used to control the flow of the material. The material to be purified may be in any liquid or in any solid.

Figure 4:
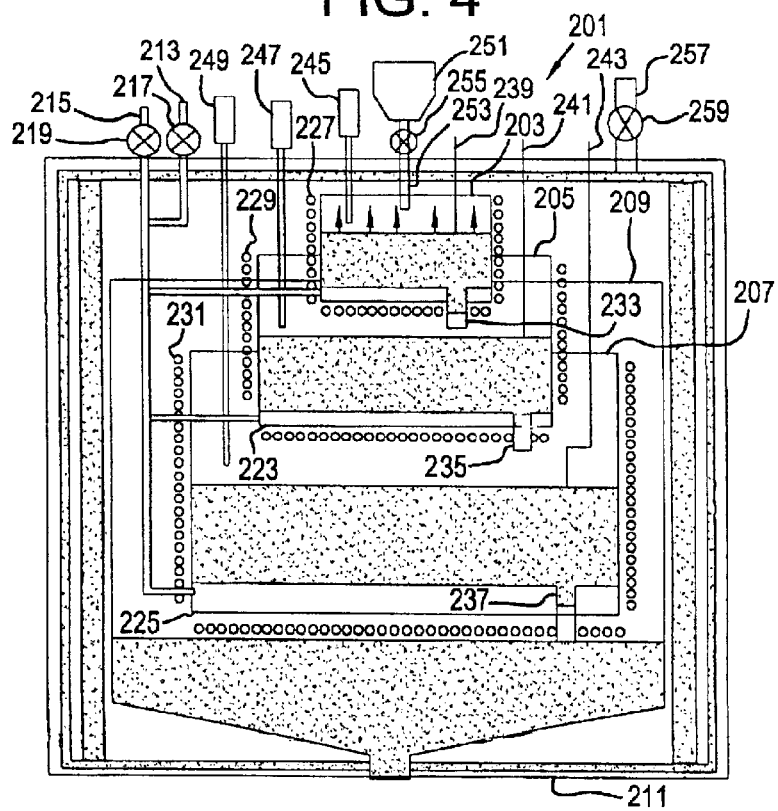
FIG. 4 shows stacked purification stations embedded in a Bridgman-Stockbarger system.

FIG. 4 shows a stacked purification station 201 embedded in a Bridgman-Stockbarger system. The stack 201 has at least one station; FIG. 4 shows three stacked purification stations 203, 205 and 207. As shown in FIG. 4, all the stations 203, 205 and 207 and the crucible 209 are contained in one vacuum chamber 211. Alternatively, separate vacuum chambers may be used for each station and the crucible. The stacked stations 203, 205 and 207 are inside or outside the crystal grower 209 for continuous shaped crystal growth, continuous plate growth, casting chamber growth, or crucible batch plate growth. The stacked stations are suitable for stand alone units that are used for refill of any type of crystal growth system, material casting system, or the like.

An embedded purification station may consist of a heater surrounded (from one or all sides) porous distributor. In that case the feed material and dopant, if any, will be added directly to the crucible. That kind of an arrangement will be excellent for purification and melt solid interface stabilization in Bridgman-Stockbarger configuration. One or more purification stations having this geometry or the chamber type described earlier can be used. The height of each station, as well as their cross-section, can vary depending on the particular application.

The gas supply 213 and the reactive gas supply 215 come from the top of the main crucible 209, as shown in FIG. 4, and may be controlled through the use of valves 217 and 219 on the gas supplies. The gas supplies 213 and 215 may have one inlet, as shown in FIG. 4, or multiple entry ports into the porous distributors 219, 221 and 223 of the purification stations 203, 205 and 207. Each purification station may be connected to one or more than one reactive gas or inert gas sources. Each station may have its own independent gas line circuit, sources, and valves. Gas or reactive gas may flood the whole vacuum chamber 211. Vacuum inlet 257 and valve 259 are used to create and control a vacuum in the chamber 211.

A purification station 203, 205 and 207 may have an open top, or a lid. The purification station may be independently heated, or it may be heated by a common heating assembly. FIG. 4 shows independent heaters 227, 229 and 231 for the purification stations 203, 205 and 207.

The plug assembly and the transfer tube with valve has a tube with a plug and a heater controlled shut-off valve. Each purification station may have more than one plug assembly or valve. The material transfer may be through openings 233, 235 and 237 on the bottom or sides of the stations. Plug assemblies 239, 241 and 243 may be used to control transfer of material through the openings to the next purification station. The transfer may be facilitated by gravity or by other means, such as a suction transfer or a similar method.

The dopant controller may provide various dopants, and the means for controlling their concentrations. This port may also be used to provide purification reactive material in both liquid and solid form. As shown, each purification station may have its own dopant distributor 245, 247 and 249.

The material to be purified may be in powder, liquid or solid form. The purified material may be a powder, a liquid, or a solidified material, or in any combination thereof. Material is provided to the first purification station 203 from a material distributor 251 through supply 253. A valve 255 may be used to control the flow of the material.

The solidified material portion may polycrystalline material, or it may be a single crystal.

The material may be any liquid substance, and any solid substance made from one or more chemical elements.

While the invention has been described with reference to specific embodiments, modifications and variations of the invention may be constructed without departing from the scope of the invention, which is defined in the following claims.

I claim:

1. A method for producing ultra pure materials comprising reducing pressure in a first station, providing a porous gas distributor in the first station, supplying material from a material supply to the porous gas distributor, supplying gas to the porous gas distributor and through the distributor into the material in contact with the distributor, heating the material with a heater adjacent the porous gas distributor as gas is passed through a material, and discharging treated material from the first station through one or more discharges.

2. The method of claim 1, further comprising tipping the first station.

3. The method of claim 1, further comprising conveying material along the porous gas distributor with a conveyor adjacent the porous gas distributor.

4. The method of claim 1, further comprising surrounding the porous gas distributor with a crucible and relatively moving the distributor and the crucible.

5. The method of claim 1, further comprising supplying dopant to the material in the first station.

6. The method of claim 1, further comprising supplying treatment, liquid or solid, to the material in the first station.

7. The method of claim 1, further comprising supplying molten material to a second station adjacent the discharge, a porous gas distributor in the second station, and a gas supply connected to the second porous gas distributor for distributing gas through the porous gas distributor and into material in the second station.

8. The method of claim 7, further comprising receiving material from the second station in a crucible and casting, crystal growing or refilling, casting or crystal growth crucibles with the crucible.

9. The method of claim 1, further comprising moving the porous gas distributor with respect to the heater.

10. The method of claim 1, further comprising holding the material in a cylindrical, hexagonal, truncated, cone or pyramid porous gas distributor, and supplying gas through the distributor into the material.

11. The method of claim 10, further comprising tipping the cylindrical porous gas distributor, positioning the material supply above a lower end of the cylindrical distributor, positioning the discharge adjacent an opposite raised end of the distributor, and tipping the cylindrical distributor for emptying material.

12. The method of claim 1, further comprising melting the material in the first station.

13. The method of claim 1, further comprising discharging multiple molten material from multiple parallel stations into a subsequent station.

14. The method of claim 13, wherein the discharging comprises discharging from multiple first stations into a second station.

15. The method of claim 14, wherein the discharging comprises discharging from multiple second stations into the crucible.

16. A method for producing ultra pure materials, comprising:
(a) providing at least one station;
(b) reducing pressure in a first station;
(c) providing a porous gas distributor in the first station;
(d) supplying material from a material supply to the porous gas distributor;
(e) supplying gas to the porous gas distributor and through the distributor into the material in contact with the distributor;
(f) heating the material with a heater adjacent the porous gas distributor as gas is passed through the material;
(g) discharging treated material from the first station through a discharge near the porous gas distributor;
(h) repeating steps (b) through (g) for each station.

17. The method of claim 16, further comprising tipping each station.

18. The method of claim 16, further comprising surrounding the porous gas distributor with a crucible and relatively moving the distributor and the crucible.

19. The method of claim 16, further comprising supplying dopant to the material in each station.

20. The method of claim 19, further comprising controlling amounts of various dopants to the material in each station.

21. The method of claim 16, further comprising supplying treatment liquid or solid, to the material in each station.

22. The method of claim 16, further comprising receiving material from a last station in a crucible and casting, crystal growing or refilling, casting or crystal growth crucibles with the crucible.

23. The method of claim 16, further comprising moving the porous gas distributor with respect to the heater.

24. The method of claim 16, further comprising holding the material in a cylindrical porous gas distributor, and supplying gas through the distributor into the material.

25. The method of claim 16, further comprising melting the material in each station.

26. The method of claim 16, further comprising transferring the material from a first station to a second station through a transfer tube.

27. The method of claim 26, further comprising controlling the transfer of the material from a first station to a second station.

28. A method for producing ultra pure materials comprising providing a first station having a reduced pressure chamber and providing a reduced pressure source for reducing pressure in and withdrawing gases from the chamber, providing a porous gas distributor within the chamber, providing a material supply for supplying material to the porous gas distributor, providing a gas source connected to the porous gas distributor for supplying gas the distributor and through the distributor to the material in contact with the porous gas distributor, providing a heater adjacent the porous gas distributor for heating the material as gas is passed through the material, and providing one or more discharges for discharging treated material from the first station.

29. A method for producing ultra pure materials comprising providing at least one station for receiving material to be purified, positioning each additional station beneath a preceding station for receiving material discharged from the preceding station, in each station providing a reduced pressure chamber and providing a reduced pressure source for reducing pressure in and withdrawing gases from the at least one chamber, providing a porous gas distributor within the chamber, providing a material supply for supplying material to the porous gas distributor of the first station, providing a gas source connected to the porous gas distributor for supplying gas to the distributor and through the distributor to the material in contact with the porous gas distributor, providing a heater adjacent the porous gas distributor for heating the material as gas is passed through the material, and providing one or more discharges for discharging treated material from each station.

30. Purification process for producing ultrapure materials, comprising providing at least one reduced pressure chamber, providing a reactive or inert gas introduction/removal assembly connected to the chamber, providing at least one porous gas distributor within the chamber, providing a gas connected to the porous distributor and the material being purified, and providing at least one material supply to the chamber.

31. The process of claim 30, further comprising providing heating elements for heating the chamber.

32. The process of claim 30, further comprising providing gas/solid/liquid materials for property modification of the material.

33. The process of claim 30, further comprising providing a cascade of more than one chamber and using the same or different reactive gases.

34. The process of claim 30, further comprising providing a material discharge assembly.

35. The process of claim 30 further comprising providing a source for reactive gas that is an in line or other ion generator.

36. The process of claim 30, further comprising providing a material holder in the chamber and oscillating/rotating the material holder.

37. The process of claim 36, wherein the holder has 0–360° inclination in all directions.

38. The method of claim 30, wherein the distributor is partially immersed in the material being purified.

39. The method of claim 30, wherein the porous distributor has ribs that have various shapes and pore sizes.

40. The method of claim 30, wherein the porous distributor is positioned to allow for proper reactive gas-purified material contact.

41. The method of claim 30, further comprising providing independent reactive gas input in the chamber.

42. The method of claim 30, further comprising providing a suitable chamber atmosphere over the melt in the chamber.

43. The method of claim 30, further comprising a material discharge.

44. The method of claim 30, further comprising providing a cascade or more than one chamber using the same or different reactive gases.

45. The method of claim 30, wherein the providing a gas source comprises providing a reactive/ambient gas that is an in line or other ion generator.

46. The method of claim 30, further comprising providing a chamber atmosphere of reactive gas or gas mixture.

47. The method of claim 46, wherein the purification station has a heater near a bottom of the purification station.

48. The method of claim 47, wherein the purification station has at least one wall heater near the purification station.

49. The method of claim 48, wherein the heater of the purification assembly has one or more zones.

50. The method of claim 47, wherein the purification station employs at least one heater for heating the crucible and the material in the crucible positioned near the purification station.

51. The method of claim 47, wherein the side of the purification station has one or more zones and is able to create temperature gradient suitable for crystal growth.

52. The method of claim 47, wherein the crucible can move in respect of the chamber and the heaters and can rotate clockwise or counterclockwise.

53. The method of claim 47, wherein the crucible has a protrusion on the bottom of the crucible contains seed for initiating crystal growth from the material already purified.

54. Purification method for producing ultrapure materials, comprising at least one reduced pressure chamber comprising reactive or inert gas introduction/removal assembly, a crucible for receiving the purified material from the purification station, at least one station for material purification employing porous distributor that might or might not have a lid, reactive gas connected to the purification station, means for material supply to the purification chamber, and means for discharge of the purified material.

* * * * *